(12) United States Patent
Miyazaki (10) Patent No.: US 6,750,431 B2
(45) Date of Patent: Jun. 15, 2004

(54) ELECTRIC COMPONENT REMOVING DEVICE

(75) Inventor: Mitsuhiko Miyazaki, Higashiosaka (JP)

(73) Assignee: Hakko Corporation, Osaka (JP)

( * ) Notice: Subject to any disclaimer, the term of this patent is extended or adjusted under 35 U.S.C. 154(b) by 0 days.

(21) Appl. No.: 10/224,272

(22) Filed: Aug. 19, 2002

(65) Prior Publication Data

US 2004/0016742 A1 Jan. 29, 2004

(30) Foreign Application Priority Data

Jul. 24, 2002 (JP) ........................................ 2002-215789

(51) Int. Cl.[7] ................................................ H05B 3/00
(52) U.S. Cl. ........................ 219/234; 219/227; 294/99.2
(58) Field of Search ........................ 219/234, 227–229; 294/99.2, 119.1; 433/162; 606/210–211

(56) References Cited

U.S. PATENT DOCUMENTS

| | | | | |
|---|---|---|---|---|
| 2,334,252 A | * | 11/1943 | Darling ...................... | 294/99.2 |
| 3,304,111 A | * | 2/1967 | Kauh et al. ................. | 294/99.2 |
| 3,804,320 A | * | 4/1974 | Vandermark ................. | 228/19 |
| 4,034,202 A | | 7/1977 | Vandermark ................. | 219/230 |
| 4,553,021 A | | 11/1985 | Conti ......................... | 219/234 |
| 5,145,101 A | | 9/1992 | Brown et al. ................. | 228/51 |
| 5,246,157 A | | 9/1993 | Siegel ......................... | 228/55 |
| 5,690,847 A | | 11/1997 | LaValley et al. ............. | 219/233 |
| 5,938,258 A | * | 8/1999 | Femling ..................... | 294/104 |
| 6,235,027 B1 | * | 5/2001 | Herzon ....................... | 606/51 |

FOREIGN PATENT DOCUMENTS

| DE | 19929255 | * | 2/2001 |
|---|---|---|---|
| JP | 57-48241 | * | 3/1982 |
| JP | 2000-139935 | * | 5/2000 |

* cited by examiner

Primary Examiner—John A. Jeffery
(74) Attorney, Agent, or Firm—Squire, Sanders & Dempsey, LLP

(57) ABSTRACT

A tweezer-type hand-held device for removing an electric or electronic component from a substrate is provided with a pair of contact pieces to be brought into contact with the component to grasp and heat the component and melt solder which fixes the component on the substrate. The contacts are respectively held by a pair of legs which, in turn, are interconnected with each other such that one of the legs moves toward the other with the legs and contact pieces being kept in parallel with each other.

14 Claims, 9 Drawing Sheets

ELECTRIC COMPONENT REMOVING DEVICE

CROSS-REFERENCE TO RELATED APPLICATIONS

This application is based on Japanese patent application serial No. 2002-215789, filed in the Japan Patent Office on Jul. 24, 2002, the contents of which are hereby incorporated by reference.

BACKGROUND OF THE INVENTION

1. Field of the Invention

The present invention relates to a device for removing an electric and/or electronic component from a substrate, and more particularly pertains to a hand-held tweezer type device for heating and reflowing solder at joints between the component and the substrate and removing the component from a substrate.

2. General Background and State of the Art

There is a need today for a quick and easy way to remove a defective electric or electronic component such as an integrated circuit from a substrate such as a printed circuit board, to allow repairing of an electric device including the substrate and component. To this end, a number of devices have been proposed and actually used in the industry.

U.S. Pat. No. 5,690,847 discloses a tweezer-like heater structure having heaters at the ends of two arms which arms are squeezed and moved toward each other to grasp the component between them. The arms of the prior art are pivoted about pivots with gears being respectively associated with the arms at the pivots, and the arms are linked with each other such that movement of one of the arms produces like movement of the other arm.

U.S. Pat. No. 5,145,101 also disclose a hand-held tweezer-type heating device having a pair of legs that are pivotally connected via a hinge to move toward each other to grasp an electronic component by means of a pair of conductive heating tip portions respectively connected to the legs via attachment pin portions.

Figure 10A:
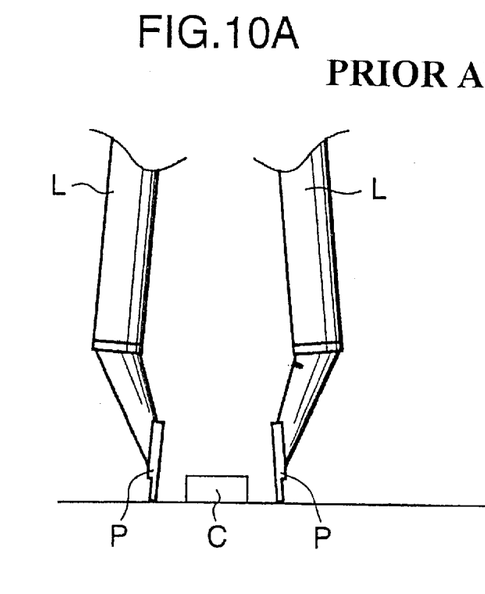
FIGS. 10A and 10B show relationship between an electronic component and a pair of tips according to the prior art.
Figure 10B:
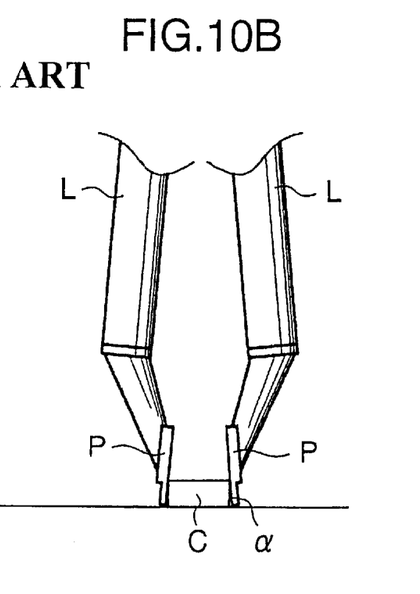

However, those prior arts devices are constructed such that the pair of arms or legs pivot or swing toward and away from each other. Accordingly, it is difficult to grasp or hold the component with the heating tips being in parallel contact with the vertical plane of the component to ensure firm grasp of the component and efficient heat transfer. In other words, legs L of the prior art, as shown in FIGS. 10A and 10B swing and approach a component from opposite sides of the component C to come into contact with the component C with a dead angle α leaving between the contact pieces P and the component C.

INVENTION SUMMARY

It is a primary object of the present invention to provide a handheld tweezer-type electric and/or electronic component removing device for heating and reflowing solder for removing an electric or electronic component from a substrate in an efficient way.

It is another object of the present invention to provide a handheld tweezer-type device which firmly grasps and efficiently heats an electronic or electric component on a substrate to reflow and remove the component from the substrate.

It is further object of the present invention to provide a handheld tweezer-type heating device that enables parallel contact between heating tips and vertical planes of an electronic or electric component.

It is still another object of the present invention to provide a handheld device for heating and picking-up an electronic or electric component from a substrate efficiently, with tips of two legs of the device being quickly positioned to the component to be removed.

It is still further object of the present invention to provide a handheld electric or electronic component removing device which can be operated smoothly and easily.

To attain one or more of the above-mentioned objects, a handheld electric and/or electronic component removing device (hereinafter simply referred to as a component remover) according to the present invention, comprises a pair of arms respectively provided, at the free ends, with a contact piece for grasping and heating the electric or electronic component, and an interconnecting mechanism for interconnecting the arms in the manner that one arm moves toward and away from the other arm with the arms being kept in parallel with each other. According to an embodiment of the present invention, the interconnecting mechanism includes a parallel link.

The above and other features, objects and advantages of the present invention will become more apparent from reading the following description of a preferred embodiment with reference to the following drawings.

BRIEF DESCRIPTION OF THE FIGURES

FIGS. 1A and 1B are top plan views showing an external appearance of a hand-held tweezer-type remover according to a preferred embodiment of the present invention, wherein FIG. 1A shows a rest condition of the remover and FIG. 1B shows operated condition of the same;

FIGS. 2A and 2B are top inside views of the embodiment shown in FIGS. 1A and 1B wherein FIG. 2A shows a rest condition of the remover and FIG. 2B shows operated condition of the same;

FIGS. 4A, 4B and 4C are partial schematic illustration of the sleeves and parallel link mechanism employed in the preferred embodiment, wherein FIG. 4A is a plane view of the sleeve and link at rest condition, FIG. 4B is also a plane view of the sleeve and link but at operated condition, and FIG. 4C is a side elevational view of a sleeve;

FIGS. 5A through 8C show various types of tips to be employed in the preferred embodiment.

DETAILED DESCRIPTION OF THE PREFERRED EMBODIMENTS

Figure 1A:
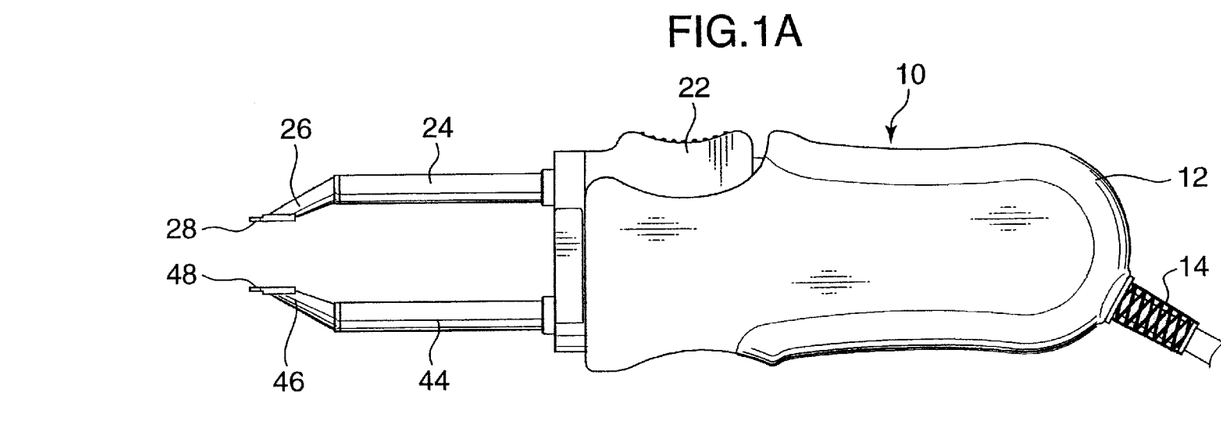

Referring to FIGS. 1A and 1B, a handheld tweezer type component remover according to a preferred embodiment of the present invention is generally referred to with a reference numeral 10. The component remover 10 includes a generally flat housing 12 having a shape to facilitate grasping by a hand. A manipulation portion 22 is serrated at the top and exposed from the housing 12 in FIG. 1A. A pair of legs 24 and 44 extend forward from the housing 12 and respectively are provided with tips 26 and 46. Contact pieces 28 and 48 are fixedly provided at the free ends of the tips 26 and 46. Reference numeral 14 denotes a cord or wire for supplying electric power from a main controller (not shown) to the remover 10 to energize and heat heaters respectively provided within the tips 26 and 46.

Figure 1B:
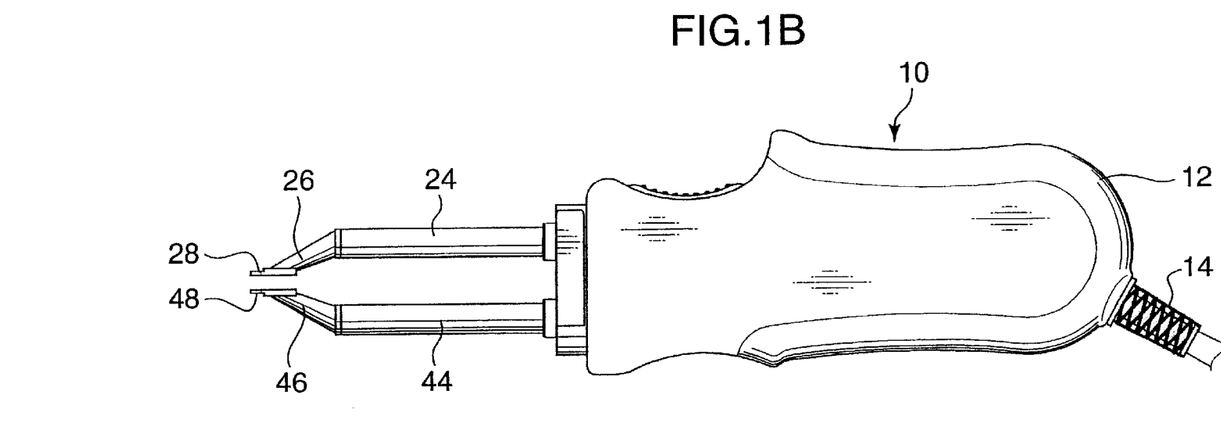

When an operator grasps the housing 12 and presses down (as viewed in the drawing) on the manipulation portion 22 with a finger, the leg 24 moves toward the leg 44 to assume the relative position as shown in FIG. 1B such that an electric or electronic component C is sandwiched between and heated by the tips 26 and 46 via contact pieces 28 and 48. (see FIGS. 9A and 9B)

Figure 2A:
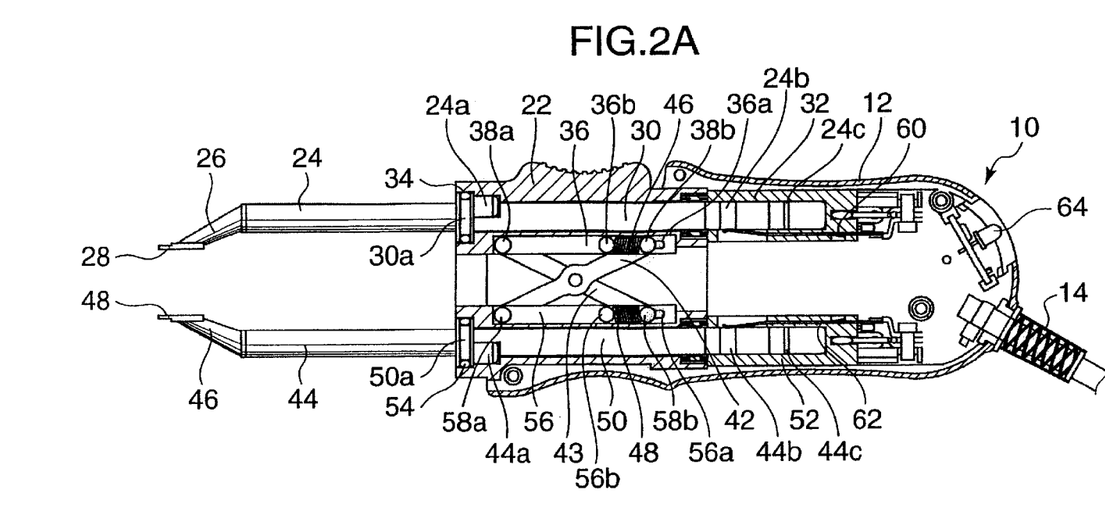
Figure 2B:
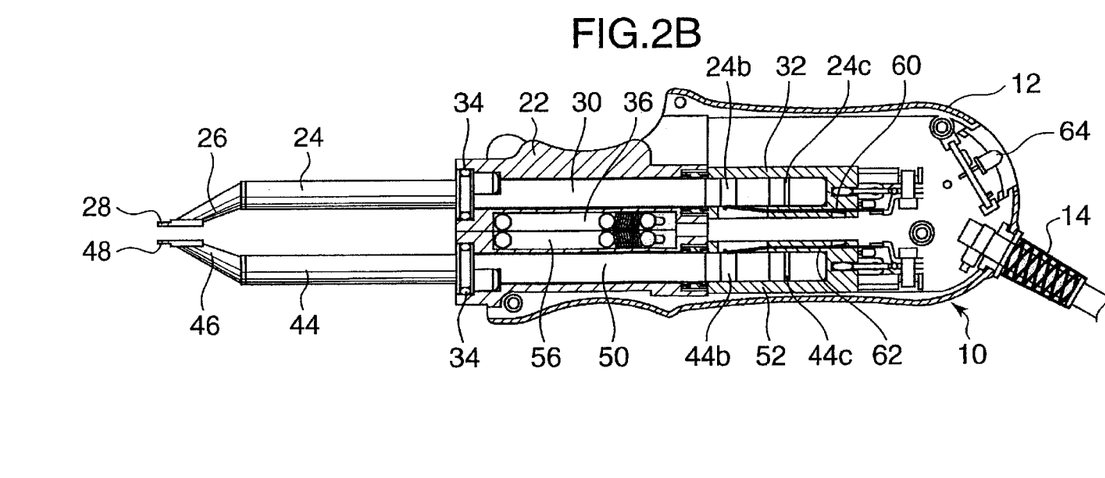
Figure 3:
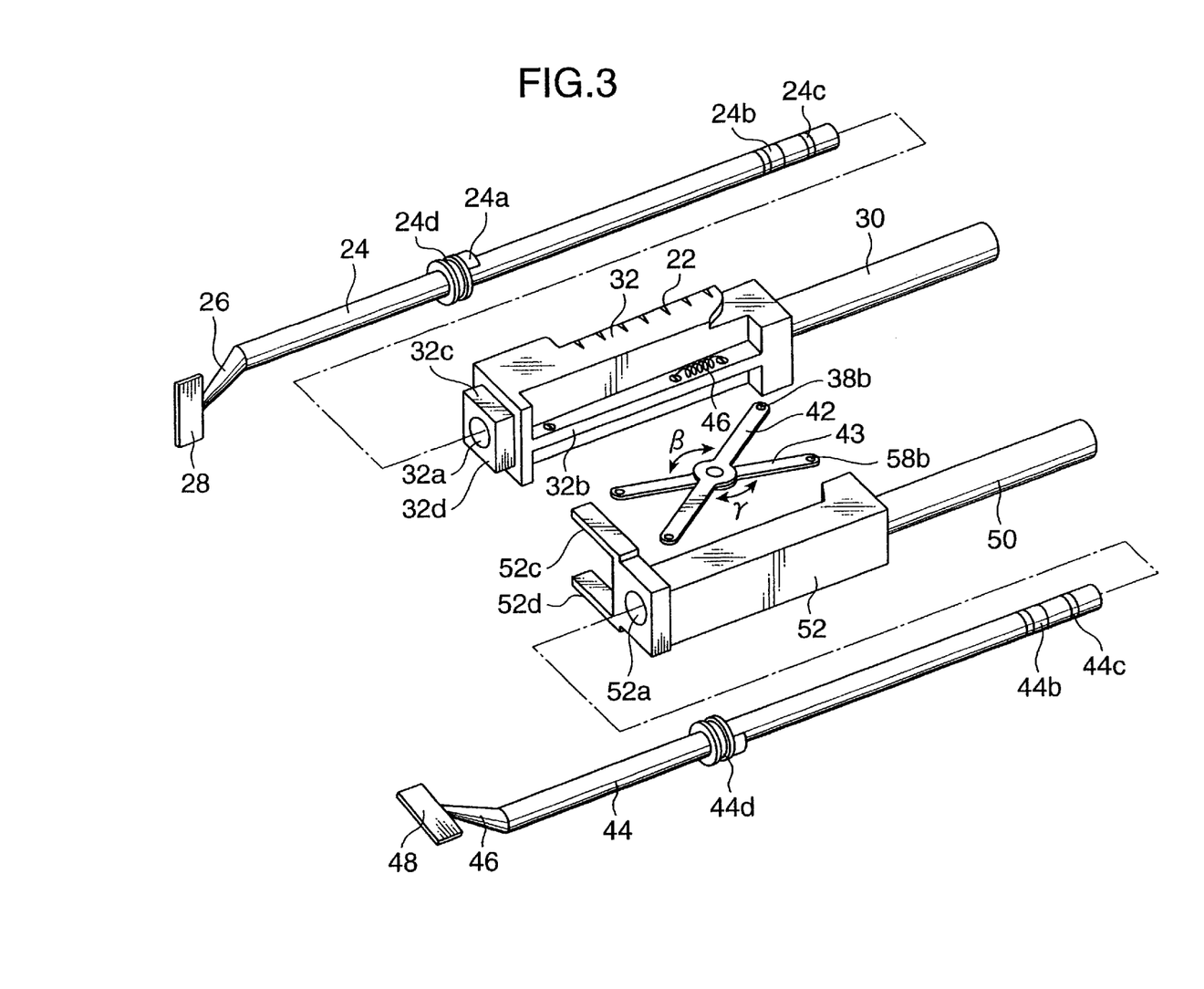
FIG. 3 is an exploded perspective view of main components of the remover.

Turning then to FIGS. 2A, 2B and 3 which show a construction of the internal mechanism within the housing 12, a pair of sockets 30 and 50 are respectively coupled with sleeves 32 and 52. In the embodiment, the left ends of the sockets 30 and 50 are respectively threaded in the hole of the sleeves 32 and 52 and fastened to the sleeves by an adhesive or bond.

The legs 24 and 44 are inserted into the holes 32a and 52a of the sleeves 32 and 52 and extend to the sockets 30 and 50 where the contacts 24b, 24c, 44b and 44c are brought into contact with corresponding leaf contact terminals in the sockets. In FIGS. 2A and 2B, leaf contact terminals 60 and 62 are shown to be in contact with and electrically connected with contacts 24b and 44b. The same kind of leaf contact terminals are provided in the sockets 30 and 50 respectively to be brought into contact with and electrically connected with contacts 24c and 44b.

Within the tips 26 and 46, respectively, are provided ohmic heaters which generate heat in response to the electric current supplied thereto. The contacts 24b, 24c, 44b and 44c are electrically connected with the heaters through wires extending within the legs 24 and 44. Thus, electric current is supplied from a power source of the main controller (not shown) through the cord 14, leaf contacts, contacts 24b, 24c, 44b and 44c, and the wires to the heaters.

The heat generated is transmitted to the contact pieces 28 and 48. A power supply switch is not shown in the Figures but is provide in the main controller which is electrically connected with the remover 10 through the cord 14. An LED 64 is provided at the rear of the housing 12 to indicate whether the temperature of the heaters in the tips 26 and 46 has been calibrated or not.

Semi-circular flanges 24a and 44a are fixedly provided midway on the legs 24 and 44 and are engaged by semi-circular projections formed within the holes 32a and 52a of the sleeves 32 and 52. The semi-circular projections are formed to be complementary with the semicircular flanges 24a and 44a and function to restrain the legs 24 and 44 such that the legs 24 and 44 do not rotate around their longitudinal axes and assume their respective angular position to make the faces of contact pieces 28 and 48 opposing each other with their faces being in parallel with each other. Guide pieces 52c and 52d extending from the sleeve 52, slidably engage upper and lower planes 32c and 32d to guide the parallel movement of the sleeve 32. Grooves 24d and 44d are formed on the legs 24 and 44 adjacent to the flanges 24a and 44d. O rings are provided in respective grooves 24d and 44d to engage the inside wall of the socket to secure the legs 24 and 44 in position within the socket.

Figure 4A:
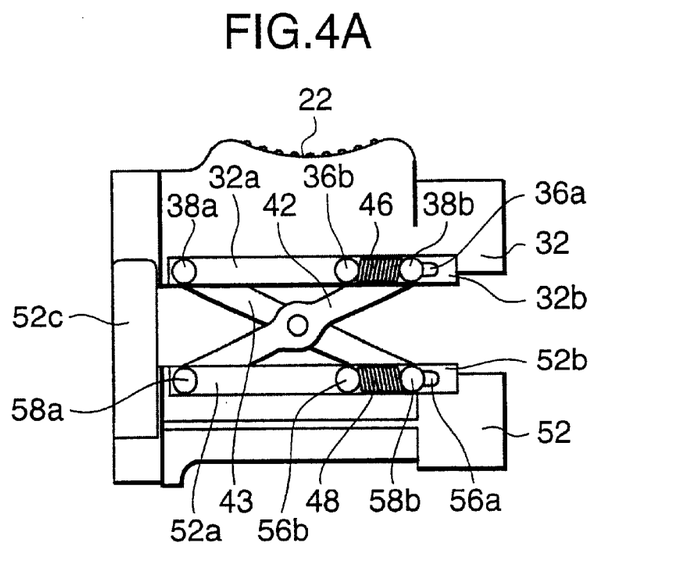
Figure 4B:
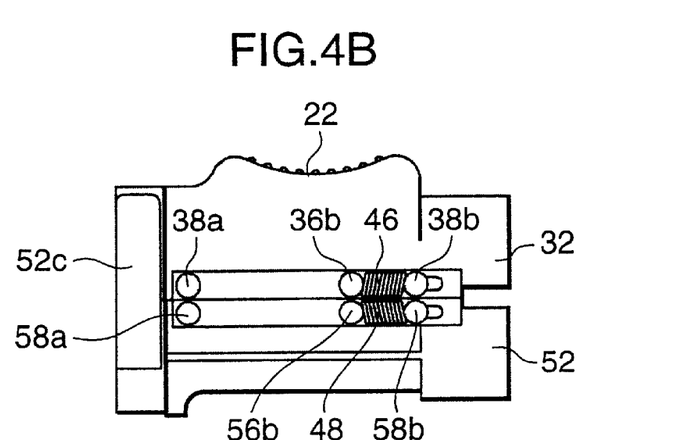
Figure 4C:
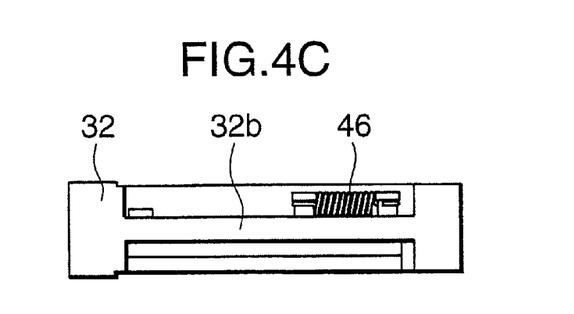
Figure 5A:
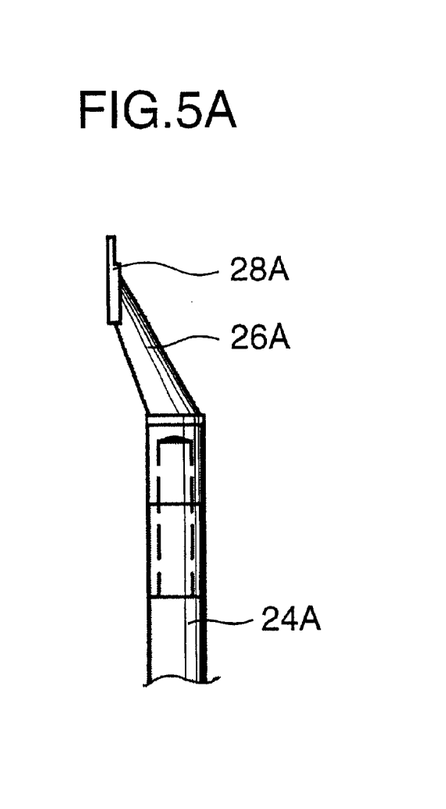
Figure 5B:
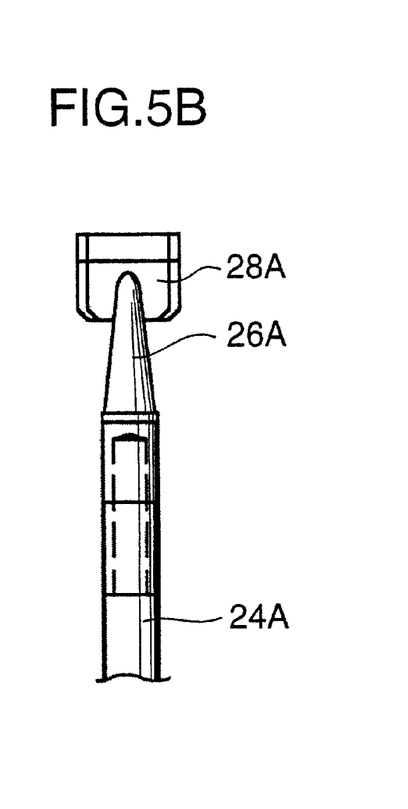
Figure 5C:
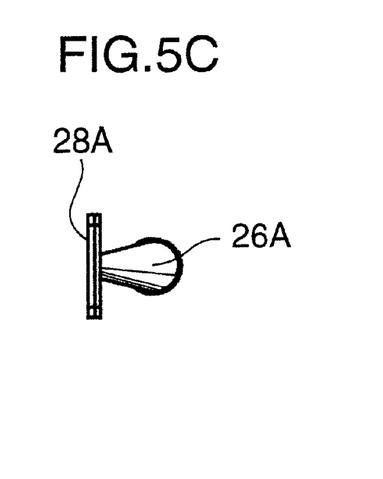
Figure 6A:
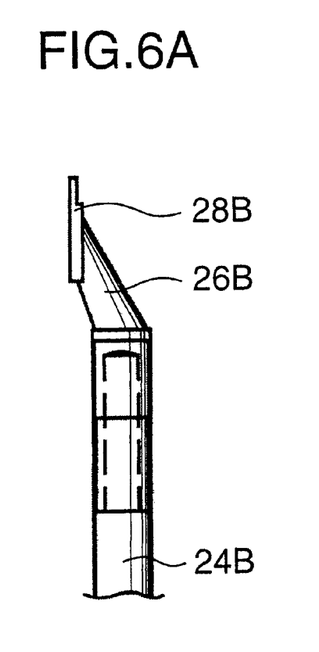
Figure 6B:
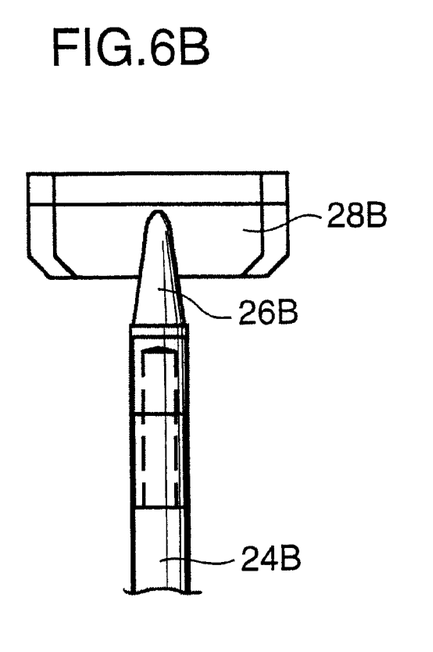
Figure 6C:
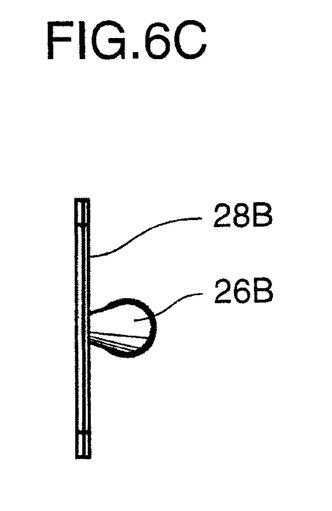

Referring to FIGS. 4A, 4B and 4C as well as FIGS. 2A, 2B and 3, a parallel link mechanism includes a pair of rods 42 and 43 which cross each other and are pivotally connected with each other at their respective center. Shelves 32a and 52a are formed on the inside walls of sleeves 32 and 52. One end of each of the rods 42 and 43 is pivotally connected with the shelf 32a or 52a via pin 38a or 58a. A pin 38b or 58b is fixed on the other end of each of the rods 42 and 43.

The pins 38b and 58b extend respectively through elongated slots 36a and 56a formed on the shelves 32a and 52a. Pins 36b and 56b are respectively fixed on the shelf 32a or 52a. Compression springs 46 and 48 are respectively connected between the pins 38b and 36b, and the pins 58b and 56b to pull the pins toward each other thereby urging the rods 36 and 56 in the direction to make their upper and lower angles B and r narrower and make the sockets 30 and 50 and accordingly the legs 24 and 43 becoming remote away from each other.

Figure 9A:
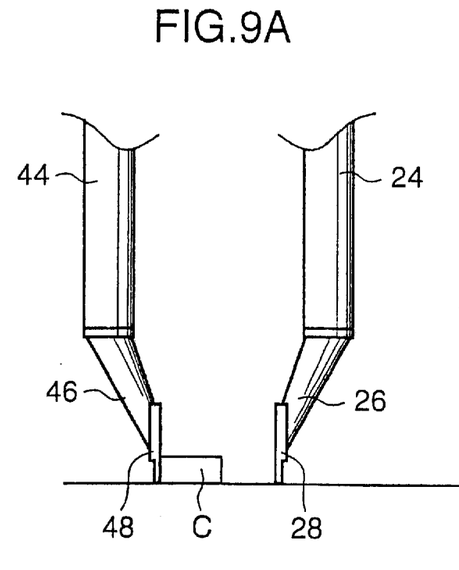
FIGS. 9A and 9B show relationship between an electronic component and a pair of tips according to the present invention.
Figure 9B:
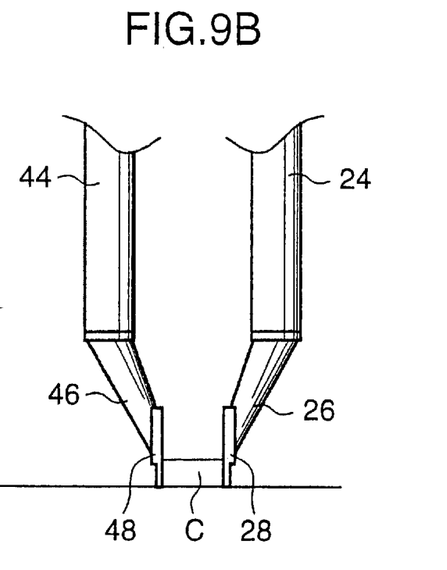

In operation, the contact piece 48 is brought into contact with one vertical plane of an electric or electronic component C as shown in FIG. 9A. Then the manipulation portion 22 is pushed down by an operator with a finger against the urging force of the springs 46 and 48, the leg 24 approaches the leg 44 to be the condition as shown in FIGS. 1B and 2B and grasp the component between the contact pieces 28 and 48 as shown in FIG. 9B, with heat being supplied to the component C through the contact pieces 28 and 44. At this time, the contact pieces 28 and 48 are in face-to-face contact with the component. It is to be noted that the legs 24 and 44 approach each other with one leg 24 moving towards the other leg 44 with the legs 24 and 44 being kept in parallel with each other.

FIGS. 5A through 8C show various types of contact pieces which are selectively employed in accordance with the component to be removed. In the Figures, FIGS. 5A, 6A, 7A and 8A are side views of the legs, tips and contact pieces of various types. FIGS. 5B, 6B, 7B and 8B are back views of the same. FIGS. 5C, 6C, 7C and 8C are bottom view of the tips and the contact pieces. The contact piece shown in FIGS. 5A, 5B and 5C has a regular width to pick up regular size components. The contact piece shown in FIGS. 6A, 6B and 6C is large in width to grasp large size components.

Figure 7A:
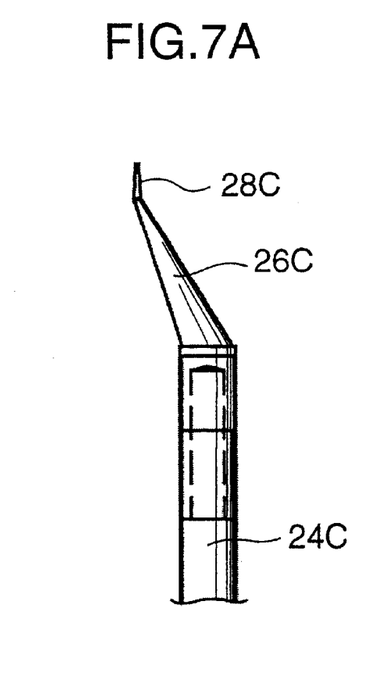
Figure 7B:
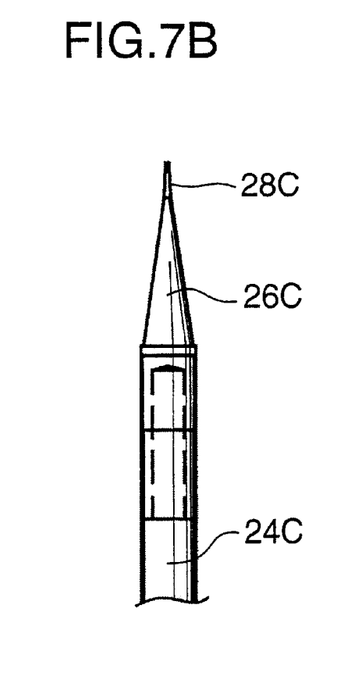
Figure 7C:
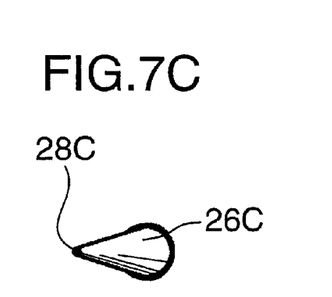
Figures 8A, 8B:
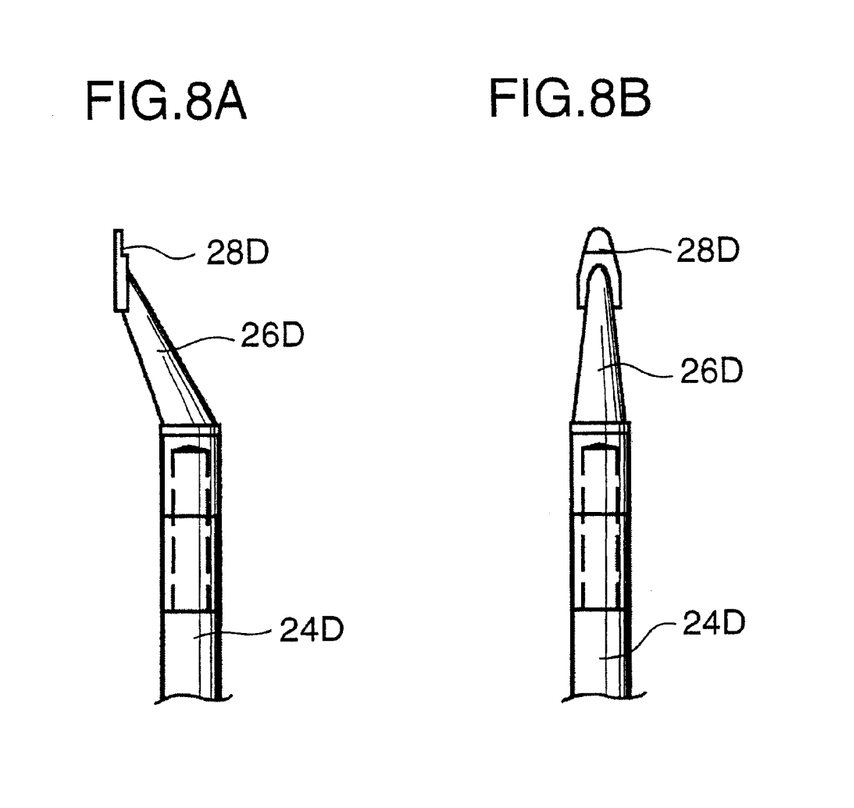
Figure 8C:
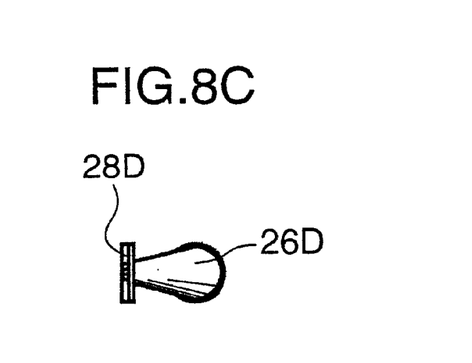

The contact piece shown in FIGS. 7A, 7B and 7C is formed as a part of the tip 26C with the thin end portion 28C of the tip 26C bent, while the contact pieces 28A, 28B and 28D are prepared independently of the tips and fixed to the tips by, for example, welding. The contact piece 28C is adapted to pick up a tiny component or a component located in an area crowded by other components. The contact piece shown in FIGS. 8A, 8B and 8C is beveled at the end such that the component is grasped with the legs 24C being slanted from its vertical posture.

With the construction of the preferred embodiment of the present invention as described above, the legs 24 and 44 grasp or hold the component C with the heating contacts 28 and 48 being in parallel contact with the vertical plane of the component C (see FIG. 9B), ensuring a firm grasp of the component and efficient heat transfer. In other words, no dead angle is left when the contacts abut against the vertical plane of the component as shown in FIG. 9B. In addition, as the parallel condition is kept while one of the legs 24 is moved toward the other leg 44, the distance between the legs at their rest positions such as shown in FIG. 2A may be small in comparison with a prior art case wherein the legs are moved angularly. Thus, the remover of the embodiment may be compact in size and shape.

According to the above mentioned embodiment, only one of the legs is moved toward the other, the tips and contact pieces can be positioned more accurately in comparison with the case where both of the legs are moved. Further, as the axis or the center of pivot of the rods 42 and 43 is closer to the tips from the end of sockets 30 and 50 and the operating points where the manipulating force is acted on is just above the center, i.e. at the same longitudinal position as the axis, the manipulating force may be exerted efficiently and an operator may handle the remover smoothly with a little force, e.g. 400 gram.

The above mentioned embodiment may also be used as a soldering copper. In that case, one of the legs 24 or 44 and contact pieces 28 or 48 may be used for heating the solder. A special soldering cooper may be prepared which has a single contact piece supported by a pair of legs. The legs have substantially the same structures as those of the legs 24 and 44 and their tip portions are joined together with each other to be connected with the single contact piece. In this case, the contact piece is double heated through two legs.

In the above, the description has been made with respect to a preferred embodiment of the present invention. However, as is apparent to those skilled in the art, the present invention is not limited to such an embodiment and various changes and modifications are available. For example, the mechanism for parallelly moving the sleeves, sockets and legs is not limited to the parallel link mechanism as shown but may be a cam mechanism having the same function as the link mechanism. The heater may be a high frequency alternative magnetic field type or other type of known heater.

What is claimed is:

1. A handheld component removing device comprising:
   a pair of legs respectively provided, at their free ends, with contact pieces for grasping and heating the component;
   an interconnecting mechanism for interconnecting the legs in a manner that a first leg moves toward and away from a second leg with the first and second legs being kept in parallel with each other; and
   a pair of holders for detachably holding the legs, and wherein the interconnecting mechanism interconnects the legs via the pair of holders.

2. A handheld component removing device according to claim 1, wherein the contact pieces have contact faces to be in contact with the component, and the holders and legs include leg-holding structure to hold the legs in the manner to retrain the angular position of the legs around their longitudinal axes and keep the contact faces opposing each other in parallel with each other.

3. A handheld component removing device according to claim 2 wherein said legs have elongated shape, said holders respectively include elongated sleeves member having longitudinally extending holes which respectively receive the legs, the legs are respectively formed with semi-circular flange portions, and the sleeve members are respectively provided, within the holes, with restraining members engageable with the semicircular flanges to define the angular position of the legs around their longitudinal axis.

4. A handheld component removing device according to claim 3, wherein said restraining members include semicircular projections having shapes complementary with the flanges on the legs.

5. A handheld component removing device according to claim 1 wherein said interconnecting mechanism includes a parallel link having a pair of rods pivotally connected with each other at their respective center, with one ends of the rods being pivotally connected with the holders and the other ends of the rods being slidably connected with the holders, and a biasing members is provided to urge the rods in the direction to make the holders space away from each other.

6. A handheld component removing device according to claim 5 wherein the biasing member include a pair of springs respectively connected between the rods and holder at the slidable connection.

7. A handheld component removing device according to claim 5 further comprising a manipulation member integrally formed with the holder at the position where the operating point on the manipulation member is at the same longitudinal position as that of the pivotal connection of the rods.

8. A handheld component removing device according to claim 1 further comprising an outer housing for fixedly holding one of the holders, and wherein a manipulation member interconnected with the other of the holders to be operated by a finger of a operator to move the latter holder such that the first leg interconnected with the holder under operation, moves towards the second leg.

9. A handheld component removing device according to claim 1 wherein each of the holders includes a sleeve member having a through hole, and a socket member fixedly coupled with the sleeve member and having a through hole coextensive and communicating with the through hole of the sleeve member, the socket member further having contact terminals, and each of the legs has an elongated shape and extends through the through holes of the sleeve member and the socket members when the legs are held by the holder, the leg having electric contact engaged by the contact terminals of the socket.

10. A handheld component removing device according to claim 9, wherein said interconnecting mechanism includes a link mechanism coupled with the sleeve members to move the sleeves toward and away from each other keeping the sleeves in parallel with each other.

11. A handheld component removing device according to claim 10, wherein each leg includes a tip portion, a heater provided within the tip portion, and a contact piece provided on the end of the tip portion to be in contact with the component to be removed, the heater being electrically connected with the contacts of the legs.

12. A handheld tweezer-type heating device comprising:
   a pair of legs respectively provided, at their free ends, with contact pieces for grasping and heating a component;
   an interconnecting mechanism for interconnecting the legs in the manner that one leg moves toward and away from the other leg;
   a housing for housing at least parts of the legs and interconnecting mechanism, the housing having a shape adapted for grasping by a hand; and
   a manipulation member associated with one of the legs to operate the leg, the other of the legs being fixedly associated with the housing such that one of the legs moves toward the other leg.

13. A handheld tweezer-type heating device according to claim 12, further comprising a pair of holders for detachably holding the legs, and wherein the interconnecting mechanism interconnects the legs via the holder, the manipulation member is integrally formed on one of the holders and the other of the holders is fixed on the housing.

14. An apparatus for removing a device, the apparatus comprising:
   a first leg having a free end with a contact piece for grasping and heating a component;
   a second leg having a free end with a contact piece for grasping and heating the component;
   an interconnecting mechanism for interconnecting the first leg so that it moves toward and away from the second leg that is substantially stationary relative to the first leg; and
   a pair of holders for detachably holding the legs, and wherein the interconnecting mechanism interconnects the legs via the pair of holders, wherein the first leg moves toward and away in a substantially parallel manner in relation to the second leg.

* * * * *